US009768229B2

(12) United States Patent
Braganca et al.

(10) Patent No.: US 9,768,229 B2
(45) Date of Patent: Sep. 19, 2017

(54) BOTTOM PINNED SOT-MRAM BIT STRUCTURE AND METHOD OF FABRICATION

(71) Applicant: Western Digital Technologies, Inc., San Jose, CA (US)

(72) Inventors: Patrick M. Braganca, San Jose, CA (US); Hsin-Wei Tseng, Cupertino, CA (US); Lei Wan, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 14/920,853

(22) Filed: Oct. 22, 2015

(65) Prior Publication Data

US 2017/0117323 A1    Apr. 27, 2017

(51) Int. Cl.
| | |
|---|---|
| G11C 11/00 | (2006.01) |
| H01L 27/22 | (2006.01) |
| G11C 11/16 | (2006.01) |
| H01L 43/02 | (2006.01) |
| H01L 43/08 | (2006.01) |
| H01L 43/12 | (2006.01) |

(52) U.S. Cl.
CPC .......... *H01L 27/228* (2013.01); *G11C 11/161* (2013.01); *G11C 11/1675* (2013.01); *H01L 43/02* (2013.01); *H01L 43/08* (2013.01); *H01L 43/12* (2013.01)

(58) Field of Classification Search
CPC ....... H01L 27/228; H01L 43/02; H01L 43/08; H01L 43/12; G11C 11/161; G11C 11/1675
See application file for complete search history.

(56) References Cited

U.S. PATENT DOCUMENTS

| | | | |
|---|---|---|---|
| 6,649,960 B1 | 11/2003 | Cross | |
| 6,876,574 B2 | 4/2005 | Giebeler et al. | |
| 7,471,539 B2 | 12/2008 | Oates et al. | |
| 8,535,952 B2 | 9/2013 | Ranjan et al. | |
| 2004/0017721 A1 | 1/2004 | Schwabe et al. | |
| 2005/0167657 A1 | 8/2005 | Nickel et al. | |
| 2012/0007196 A1* | 1/2012 | Natori | H01L 27/228 257/421 |
| 2014/0264671 A1* | 9/2014 | Chepulskyy | H01L 43/08 257/421 |
| 2014/0269032 A1 | 9/2014 | Ong et al. | |
| 2015/0036415 A1* | 2/2015 | Di Pendina | G11C 11/18 365/148 |
| 2015/0041934 A1* | 2/2015 | Khvalkovskiy | H01L 43/02 257/421 |

* cited by examiner

*Primary Examiner* — Toan Le
(74) *Attorney, Agent, or Firm* — Stoel Rives LLP

(57) ABSTRACT

Embodiments of the present disclosure generally relate to data storage and computer memory systems, and more particularly, to a SOT-MRAM chip architecture. The SOT-MRAM chip architecture includes a plurality of leads, a plurality of memory cells, and a plurality of transistors. The leads may be made of a material having large spin-orbit coupling strength and high electrical resistivity. Each lead of the plurality of leads may include a plurality of first portions and a plurality of second portions distinct from the first portions. The electrical resistivity of the second portions is less than that of the first portions, so the total electrical resistivity of the lead is reduced, leading to improved power efficiency and signal to noise ratio.

22 Claims, 10 Drawing Sheets

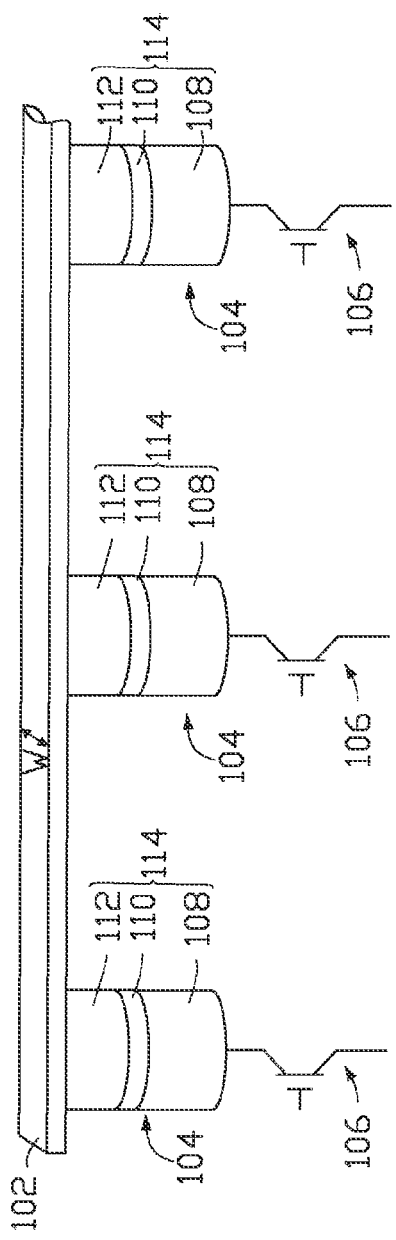
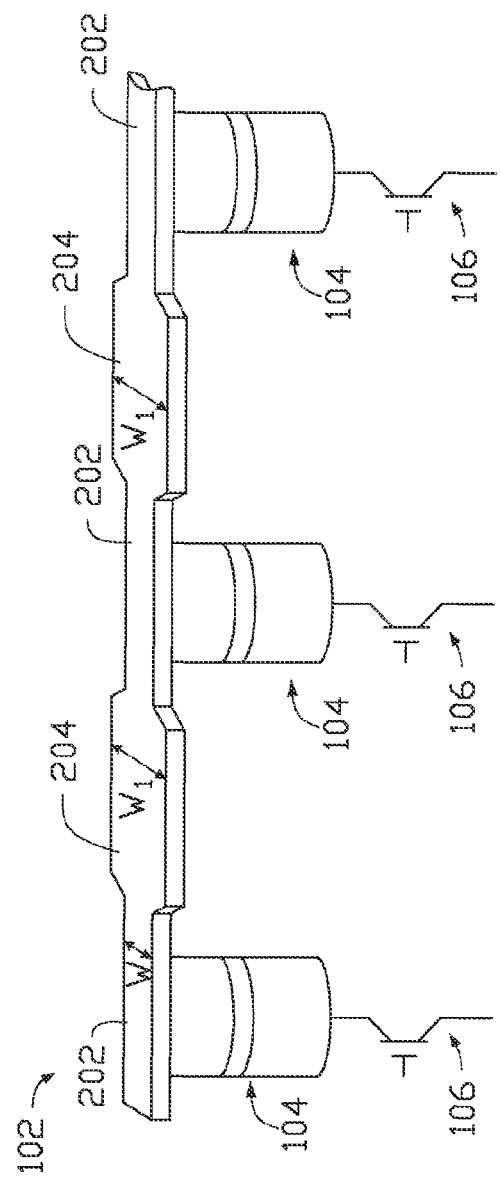

BOTTOM PINNED SOT-MRAM BIT STRUCTURE AND METHOD OF FABRICATION

BACKGROUND OF THE DISCLOSURE

Field of the Disclosure

Embodiments of the present disclosure generally relate to data storage and computer memory systems, and more particularly, to a spin-orbit torque magnetoresistive random access memory (SOT-MRAM) chip architecture.

Description of the Related Art

The heart of a computer is a magnetic recording device which typically may include a rotating magnetic media or a solid state media device. A number of different memory technologies exist today for storing information for use in a computing system. These different memory technologies may, in general, be split into two major categories: volatile memory and non-volatile memory. Volatile memory may generally refer to types of computer memory that require power to retain stored data. Non-volatile memory, on the other hand, may generally refer to types of computer memory that do not require power in order to retain stored data. Examples of volatile memory may include certain types of random access memory (RAM), such as dynamic RAM (DRAM) and static RAM (SRAM). Examples of non-volatile memory may include read-only memory (ROM), magnetoresistive RAM (MRAM), and flash memory, such as NOR and NAND flash, etc.

In recent years there has been a demand for higher density devices, which maintain a relatively low cost per bit, for use in high capacity storage and memory applications. Today the memory technologies that generally dominate the computing industry are DRAM and NAND flash; however these memory technologies may not be able to address the current and future capacity demands of next generation computing systems.

Recently, a number of emerging technologies have drawn increasing attention as potential contenders for next generation memory. One such memory technology is magnetoresistive random access memory (MRAM). MRAM offers fast access time, nearly infinite read/write endurance, radiation hardness, and high storage density. Unlike conventional RAM chip technologies, MRAM data is not stored as an electric charge, but instead stores data bits using the magnetic polarization state of magnetic elements. The elements are formed from two magnetically polarized layers, each of which can maintain a magnetic polarization field, separated by a thin insulating layer, which together form a magnetic tunnel junction (MTJ) structure. MRAM cells including MTJ memory elements can be designed for in-plane or perpendicular magnetization of the MTJ layer structure with respect to the film surface. One of the two layers (referred to as a fixed or reference layer) has its magnetization fixed and set to a particular polarity, for example by coupling the layer to an antiferromagnet; the polarization of the second layer (referred to as a free layer) is free to rotate under the influence of an external writing mechanism such as a strong magnetic field or a spin polarized electric current (which is used in a form of MRAM know as spin-torque transfer or STT-MRAM).

However, the MTJ memory elements in STT-MRAM devices suffer from wear-effects due to driving a sufficient amount of current for switching through the MTJ, including through the barrier layer. Typically, a large amount of current is required for switching the state of the cell. Over time, the barrier layer breaks down due to the large amount of current, rendering the MTJ useless.

Therefore, there is a need in the art for an improved MRAM device.

SUMMARY

Embodiments of the present disclosure generally relate to data storage and computer memory systems, and more particularly, to a SOT-MRAM chip architecture. The SOT-MRAM chip architecture includes a plurality of leads, a plurality of memory cells, and a plurality of transistors. The leads may be made of a material having large spin-orbit coupling strength and high electrical resistivity. Each individual lead may include a plurality of first portions and a plurality of second portions distinct from the first portions. The electrical resistivity of the second portions is less than that of the first portions, so the total electrical resistivity of the lead is reduced, leading to improved power efficiency and signal to noise ratio.

In one embodiment, a SOT-MRAM chip architecture includes a plurality of leads made of a material including Pt, Ta, W, Hf, Ir, CuBi, CuIr, or AuW, a plurality of memory cells coupled to each lead of the plurality of leads, and a plurality of transistors. Each transistor is coupled to a corresponding memory cell of the plurality of memory cells.

In another embodiment, a SOT-MRAM chip architecture includes a plurality of leads, and each lead has a plurality of first portions and a plurality of second portions distinct from the first portions. Each first portion of the plurality of first portions has a first width and each second portion of the plurality of second portions has a second width, and the first width is smaller than the second width. The SOT-MRAM chip architecture further includes a plurality of memory cells coupled to the first portions of each lead, and a plurality of transistors. Each transistor is coupled to a corresponding memory cell of the plurality of memory cells.

In another embodiment, a SOT-MRAM chip architecture includes a plurality of leads, and each lead has a plurality of first portions and a plurality of second portions distinct from the first portions. Each first portion of the plurality of first portions is made of a first material and each second portion of the plurality of second portions is made of a second material, and the first material is different from the second material. The SOT-MRAM chip architecture further includes a plurality of memory cells coupled to the first portions of each lead, and a plurality of transistors. Each transistor is coupled to a corresponding memory cell of the plurality of memory cells.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1 is a schematic perspective view of a single lead, a plurality of memory cells and a plurality of transistors according to one embodiment described herein.

FIG. 2 is a schematic perspective view of the single lead, the plurality of memory cells and the plurality of transistors according to another embodiment described herein.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 3:
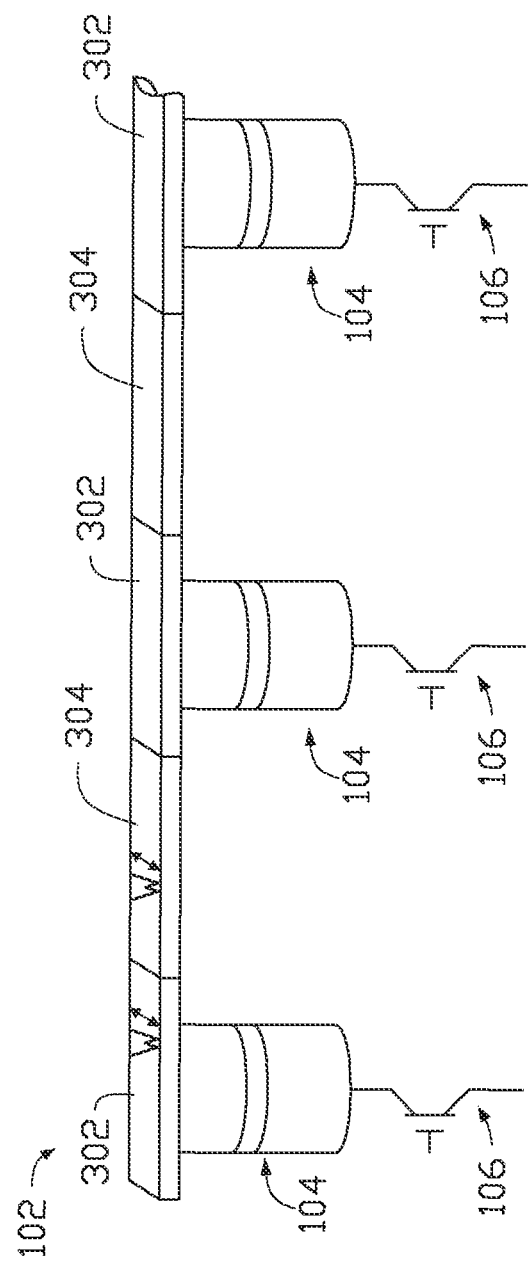
FIG. 3 is a schematic perspective view of the single lead, the plurality of memory cells and the plurality of transistors according to another embodiment described herein.

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Embodiments of the present disclosure generally relate to data storage and computer memory systems, and more particularly, to a SOT-MRAM chip architecture. The SOT-MRAM chip architecture includes a plurality of leads, a plurality of memory cells, and a plurality of transistors. The leads may be made of a material having large spin-orbit coupling strength and high electrical resistivity. Each lead of the plurality of leads may include a plurality of first portions and a plurality of second portions distinct from the first portions. The electrical resistivity of the second portions is less than that of the first portions, so the total electrical resistivity of the lead is reduced, leading to improved power efficiency and signal to noise ratio.

FIG. 1 is a schematic perspective view of a single lead 102, a plurality of memory cells 104 and a plurality of transistors 106 according to one embodiment described herein. The lead 102, the plurality of memory cells 104 and the plurality of transistors 106 may be a portion of a SOT-MRAM chip architecture. The SOT-MRAM chip architecture may include a plurality of leads 102, each may be attached to the plurality of memory cells 104. The lead 102 may be made of a material having large spin-orbit coupling strength, such as Pt, Ta, W, Hf, Ir, CuBi, CuIr, or AuW. Materials having large spin-orbit coupling strength may have high electrical resistivity, such as from about 150 µΩcm to about 250 µΩcm. The material having large spin-orbit coupling strength is referred to herein as spin-orbit torque (SOT) material. The electrical resistivity of the SOT material is much greater than the electrical resistivity of conductive metals, such as copper. In one embodiment, the lead 102 may have a constant width W that is about the dimension of one memory cell 104 of the plurality of memory cells 104. The width W may range from about 10 nm to about 500 nm. The plurality of memory cells 104 may be electrically coupled to the lead 102. Three memory cells 104 are shown in FIG. 1, but more than three memory cells 104 may be electrically coupled to the lead 102. Each memory cell 104 includes a MTJ element 114 having a reference layer 108, a barrier layer 110, and a free layer 112. The free layer 112 may be in contact with the lead 102. Alternatively, an in-stack layer (not shown) may be between the free layer 112 and the lead 102. The free layer 112 may comprise one of Ni, Fe, Co, B, Ge, Mn, and/or alloys of Ni, Fe, Co, B, Ge, or Mn, and/or combinations and mixtures thereof, such as NiFe, CoFe, or CoFeB. The magnetic moment of the free layer 112 may be in the plane of the layer or perpendicular to the plane of the layer. The barrier layer 110 may be made of a nonmagnetic metal such as Cu or Ag, or an insulating material such as alumina, MgO, or HfO. The reference layer 108 may comprise one of Ni, Fe, Co, B, Ge, Mn, and/or alloys of Ni, Fe, Co, B, Ge, or Mn, and/or combinations and mixtures thereof, such as NiFe, CoFe, or CoFeB, and/or Co/Pt, Co/Pd, or Co/Ni superlattices. The magnetic moment of the reference layer 108 may be in the plane of the layer or perpendicular to the plane of the layer. The reference layer 108 can be simple pinned or antiparallel (AP) pinned. Each transistor 106 of the plurality of transistors 106 may be electrically coupled to a corresponding memory cell 104, as shown in FIG. 1. The transistor 106 may be any semiconductor device that is capable of switching electrical power, such as a complementary metal-oxide-semiconductor (CMOS) transistor.

During operation, writing can be done by a half-select mechanism which includes the combination of flowing a current through the lead 102 and biasing a single memory cell 104 through the transistor 106 that is electrically coupled to the memory cell 104. Spin orbit torques (SOT) can originate from spin hall or Rashba effects which are generated by the current flowing through the lead 102. Flowing the current through the lead 102 alone is not enough to switch the state of the memory cell 104. In one embodiment, the current flowing through the lead 102 is half of a current that would cause the memory cell 104 to switch. In order to select a particular memory cell 104 for writing process, a voltage is applied to the memory cell 104 to generate a voltage controlled magnetic anisotropy (VCMA) effect. The VCMA effect can be explained in terms of the electric-field-induced change of occupancy of atomic orbitals at the interface in the MTJ of the memory cell 104, which, in conjunction with spin-orbit interaction, results in a change of anisotropy. For example, a decrease in the electron density at the interface increases perpendicular anisotropy. Since this magnetoelectric coupling is not strain-mediated, it is not endurance limited, making it compatible with logic and memory applications. The combination of SOT and VCMA selects the particular memory cell 104 for writing process. Here, the resistance of the barrier layer 110 is tuned to be large enough that the current flowing through the lead 102 is relatively small. Reading can be done by flowing a current through the lead 102 and using a transistor 106 to select a particular memory cell 104.

In another embodiment, the barrier layer 110 resistance can be made low enough that the current across the MTJ of a particular memory cell 104 is half the current that would cause the memory cell 104 to switch. Here, a combination of SOT and direct spin torque transfer from the current selects the particular memory cell 104 for writing process.

In order to increase the torque acting on the memory cells 104, the thickness of the lead 102 may be around the order of the spin diffusion length of the SOT material being used, which is typically on the order of 5-10 nm, and the width W of the lead 102 may be around the dimension of the memory cell 104 (to increase current density). Since the lead 102 is made of the SOT material having high electrical resistivity and the lead 102 has a relatively small thickness and width, issues such as heat generation or less power efficiency (large voltage applied due to high electrical resistivity) may occur. In order to improve power efficiency and reduce heat generation in the lead 102, the lead 102 may be modified to reduce the electrical resistance of the lead 102.

FIG. 2 is a schematic perspective view of the lead 102, the plurality of memory cells 104 and the plurality of transistors 106 according to another embodiment described herein. As shown in FIG. 2, the lead 102 may include a plurality of first portions 202 and a plurality of second portions 204 distinct from the first portions 202. The first portions 202 and the second portions 204 may be made of the same material, such as the SOT material. Each first portion 202 of the plurality of first portions 202 has a width W and each second portion 204 of the plurality of second portions 204 has a width $W_1$. The widths W and $W_1$ may range from about 10 nm to about 500 nm with the width $W_1$ being greater than the width W. Each first portion 202 may be electrically coupled to a memory cell 104, and each second portion 204 may be between two first portions 202. Each second portion 204 is spaced from a memory cell 104 and is not in contact with a memory cell 104. In other words, each second portion 204 may be between adjacent memory cells 104. The smaller width W of the first portions 202 coupled to the memory cells 104 increases the torque acting on the memory cells 104 due to increased current density. The larger width $W_1$ of the second portions 204 reduces the electrical resistivity of the second portions 204, which leads to an overall reduced electrical resistivity of the lead 102. As a result of the lead 102 having second portions 204 that are wider than first portions 202, power efficiency is increased due to less voltage applied to the lead 102.

FIG. 3 is a schematic perspective view of the lead 102, the plurality of memory cells 104 and the plurality of transistors 106 according to another embodiment described herein. As shown in FIG. 3, the lead 102 may include a plurality of first portions 302 and a plurality of second portions 304 distinct from the first portions 302. Each first portion 302 of the plurality of first portions 302 has a width W and each second portion 304 of the plurality of second portions 304 has the same width W. Each first portion 302 may be electrically coupled to a memory cell 104, and each second portion 304 may be between two first portions 302. Each second portion 304 is not in contact with a memory cell 104. In other words, each second portion 304 may be between adjacent memory cells 104. The first portions 302 of the lead 102 may be made of the SOT material, such as Pt, Ta, W, Hf, Ir, CuBi, CuIr, or AuW. The second portions 304 of the lead 102 may be made of a material having lower electrical resistivity than the first portions 302. In one embodiment, the second portions 304 of the lead 102 are made of one or more layers, with at least one layer comprised of a material having lower electrical resistivity than the first portions 302. In one embodiment, the second portions 304 are made of a single layer of conductive metal, such as copper or aluminum, or a bilayer of conductive metal/SOT material, where the SOT material may be the same material as the first portions 302. In another embodiment, the second portions 304 are made of a doped material, such as Ta doped with nitrogen. The doped material of the second portions 304 may include a base material and a dopant. The base material may be the same material as the first portions 302. By doping the base material with a dopant, the electrical resistivity of the second portions 304 is lower than that of the first portions 302. In some embodiments, the first portions 302 are made of a doped material including a base material and a dopant. The base material may be the same material as the second portions 304. By doping the base material with a dopant, the electrical resistivity of the first portions 302 is higher than that of the second portions 304. Having the second portions 304 made of a material having less electrical resistance than the first portions 302 leads to an overall reduced electrical resistivity of the lead 102. As a result of the lead 102 having second portions 304 that are made of a material having less electrical resistance than the first portions 302, power efficiency is increased due to less voltage applied to the lead 102.

Referring back to FIG. 2, the overall electrical resistivity of the lead 102 may be further reduced by using a more electrically conductive material for the second portions 204. In one embodiment, the first portions 202 may be made of the SOT material, such as Pt, Ta, W, Hf, Ir, CuBi, CuIr, AuW, and the second portions 204 may be made of the same material the as the second portion 304 (FIG. 3). In one embodiment, the second portions 204 may be made of one or more layers, with at least one layer comprised of a material which has less electrical resistivity than the first portions 202. The combination of the wider width $W_1$ and more electrically conductive material of the second portions 204 lead to an overall reduced electrical resistivity of the lead 102.

Figure 4A:
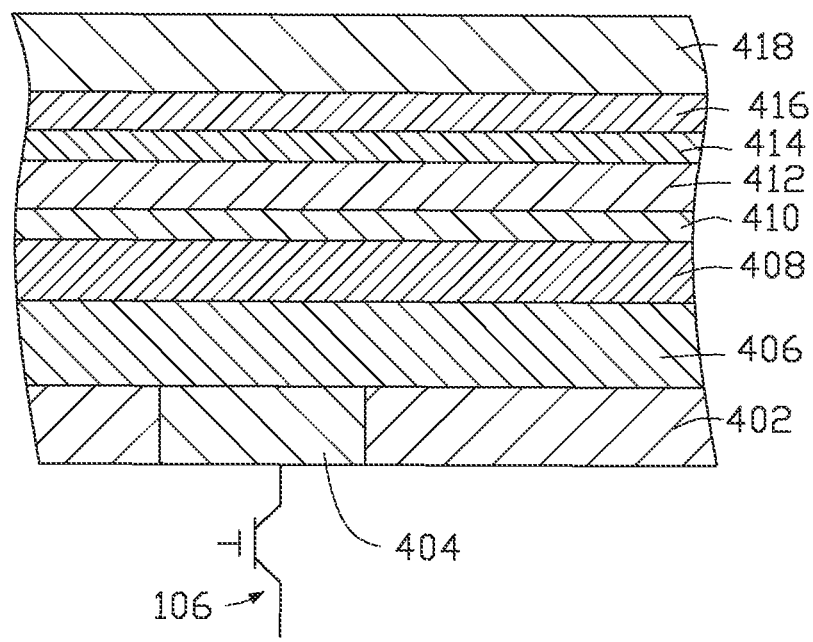
FIGS. 4A-4J schematically illustrate process steps to form the lead and a memory cell according to one embodiment described herein.

FIGS. 4A-4J schematically illustrate process steps to form the lead 102 and a memory cell 104 of the plurality of memory cells 104 according to one embodiment described herein. As shown in FIG. 4A, a substrate 402 including a metal pad 404 may be electrically coupled to a transistor 106. An underlayer 406 may be formed on the substrate 402. The underlayer 406 may include multiple layers such as a seed layer for seeding MTJ growth and an AFM layer for pinning the reference layer. A first ferromagnetic layer 408 may be formed on and in contact with the underlayer 406, a barrier layer 410 may be formed on and in contact with the first ferromagnetic layer 408, and a second ferromagnetic layer 412 may be formed on and in contact with the barrier layer 410. The first ferromagnetic layer 408 may be made of the same material as the reference layer 108 (FIG. 1), the barrier layer 410 may be made of the same material as the barrier layer 110 (FIG. 1), and the second ferromagnetic layer 412 may be made of the same material as the free layer 112 (FIG. 1). A first SOT layer 414 may be formed on and in contact with the second ferromagnetic layer 412. The first SOT layer 414 may be made of SOT material and has a thickness of about 2 nm to about 5 nm. A sacrificial layer 416 may be formed on and in contact with the first SOT layer 414. The sacrificial layer 416 may be made of a material that is easily etched, such as copper, aluminum, or silver. The thickness of the sacrificial layer 416 may be about 2 nm to about 10 nm. A hard mask 418 may be formed on and in contact with the sacrificial layer 416. The hard mask 418 may be made of a material having a slow etch rate, such as diamond-like carbon, alumina, TaN, or W. The layers 406-418 may be formed by any suitable method, such as physical vapor deposition, chemical vapor deposition, or plasma enhanced chemical vapor deposition, and may be formed in the same processing chamber.

Figure 4B:
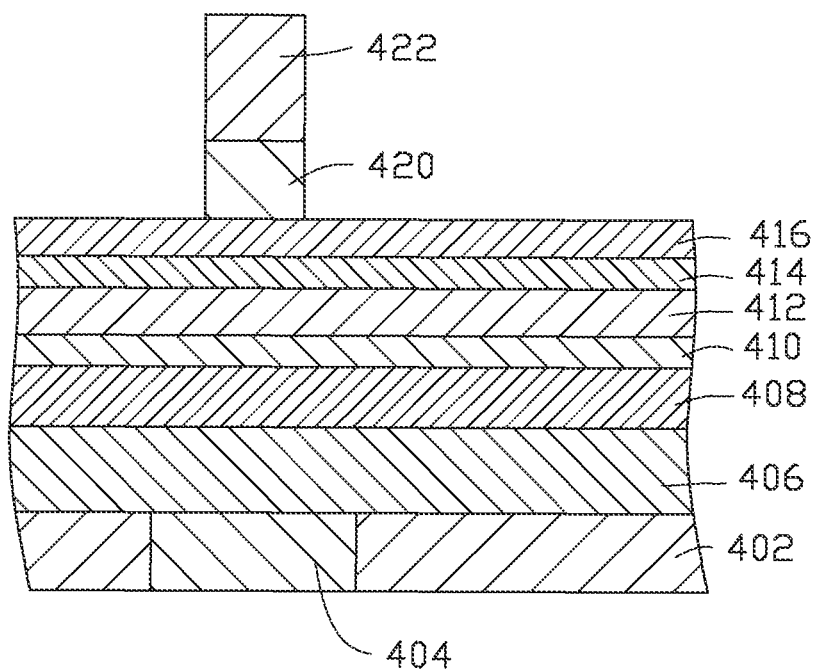
Figure 4C:
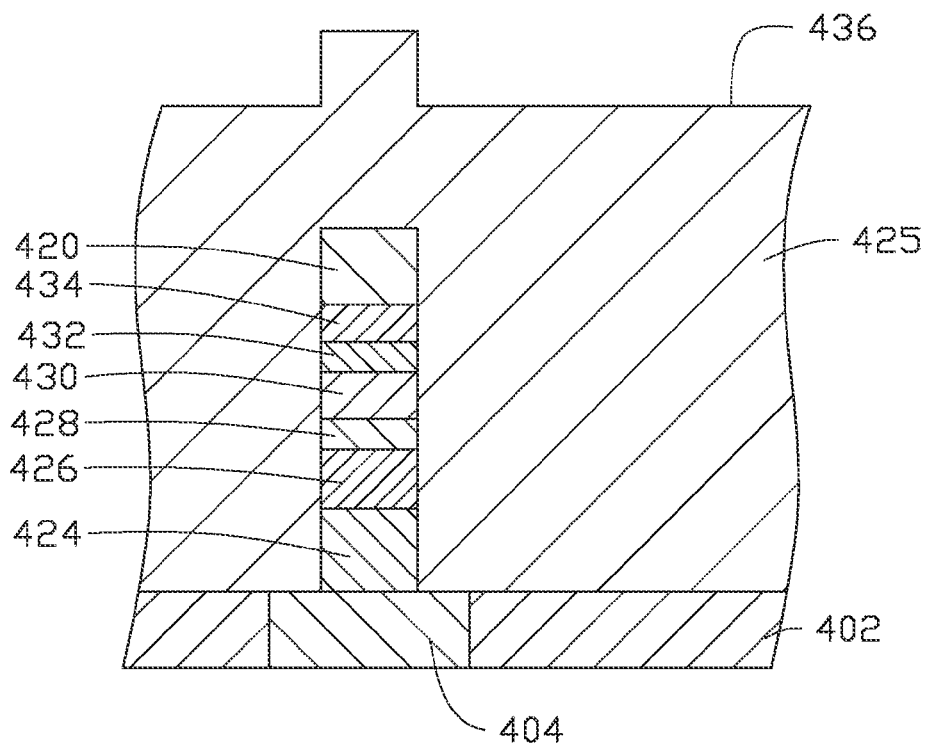
Figure 4D:
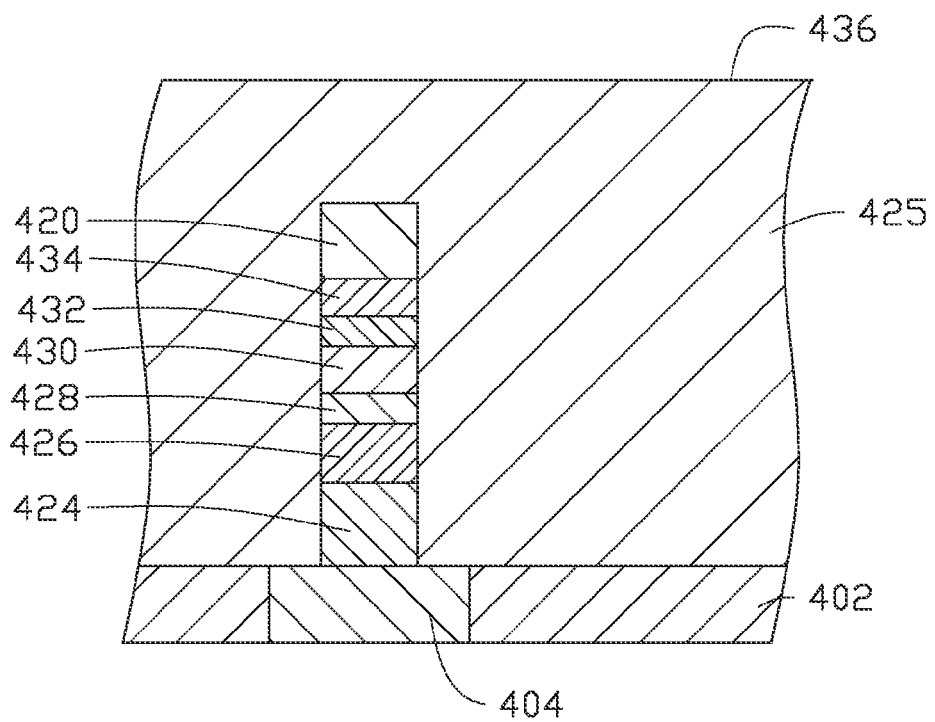

Next, a photoresist 422 is formed and patterned on the hard mask 418, and the pattern is transferred to the hard mask 418 to form a hard mask 420 using reactive ion etch (RIE) or wet etch, as shown in FIG. 4B. The transistor 106 is omitted to better illustrate the stack. Next, as shown in FIG. 4C, the pattern is transferred to all of the layers over the substrate 402. Portions of the underlayer 406 are removed to form an underlayer 424, portions of the first ferromagnetic layer 408 are removed to form a reference layer 426, portions of the barrier layer 410 are removed to form a barrier layer 428, portions of the second ferromagnetic layer 412 are removed to form a free layer 430, portions of the first SOT layer 414 are removed to form a second SOT layer 432, and portions of the sacrificial layer 416 are removed to form a sacrificial layer 434. The reference layer 426 may be the reference layer 108 (FIG. 1), the barrier layer 428 may be the barrier layer 110 (FIG. 1), and the free layer 430 may be the free layer 112 (FIG. 1). The reference layer 426, the barrier layer 428, and the free layer 430 may form the memory cell 104. The removal processes may be any suitable removal process, such as ion milling or RIE. A dielectric material 425 may be deposited over the substrate 402 and the stack of layers. The dielectric material 425 may be alumina, $SiO_2$, $TaO_x$, or other suitable dielectric material. The dielectric material 425 may be deposited using any suitable deposition method, such as ion beam deposition, plasma enhanced chemical vapor deposition, physical vapor deposition, atomic layer deposition, or spin-on. In some embodiments, the dielectric material 425 does not have a planar top surface 436, as shown in FIG. 4C, and a chemical mechanical polishing (CMP) process may be performed to planarize the top surface 436 of the dielectric material 425. As shown in FIG. 4D, after the planarization process, the top surface 436 of the dielectric material 425 is planar. In one embodiment, the dielectric material 425 is deposited as a spin-on glass, and the top surface 436 is approximately planar without performing the CMP process.

Figure 4E:
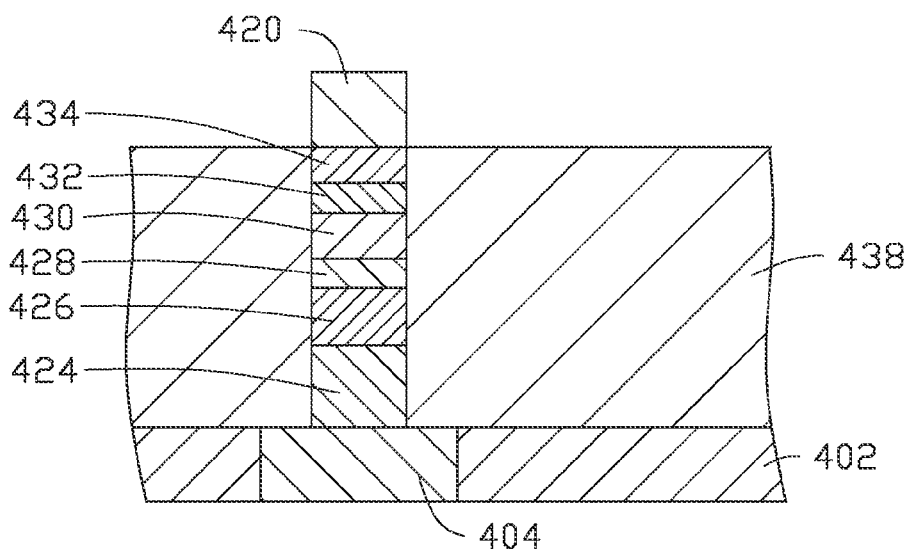
Figure 4F:
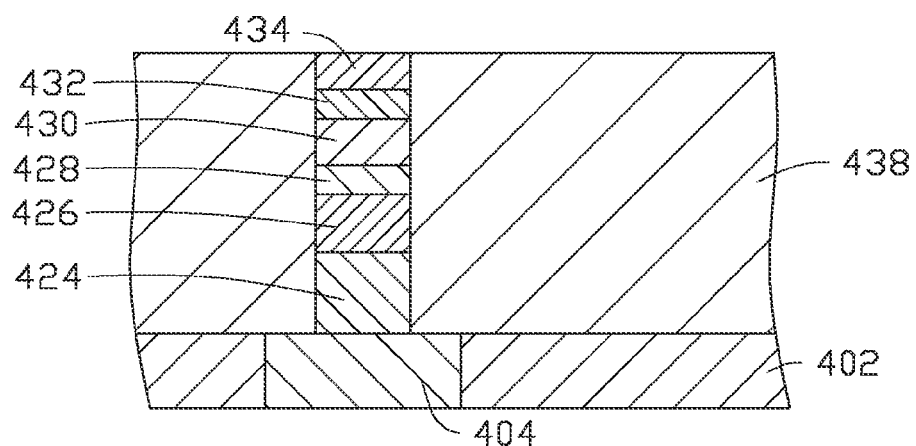
Figure 4G:
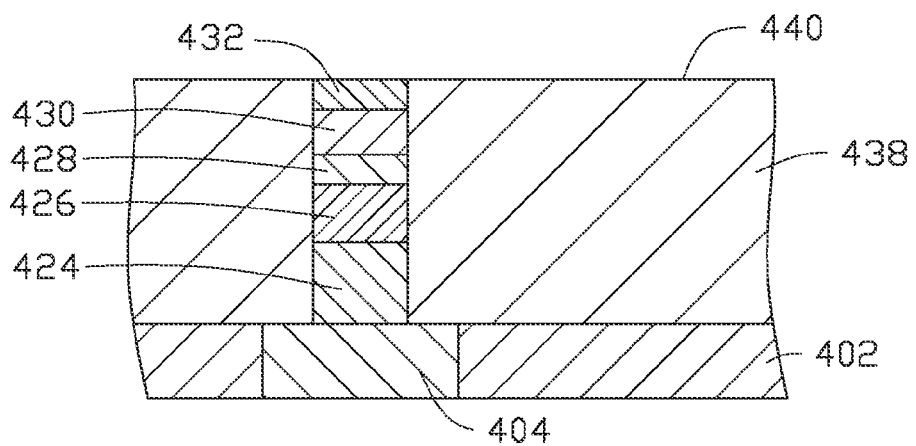

Next, as shown in FIG. 4E, portions of the dielectric material 425 are removed so the remaining portion 438 of the dielectric material is level with the sacrificial layer 434. The portions of the dielectric material 425 may be removed by ion milling or RIE. The hard mask 420 may be removed by RIE, as shown in FIG. 4F. Next, the sacrificial layer 434 and portions of the remaining portion 438 of the dielectric material 425 are removed, exposing the second SOT layer 432, as shown in FIG. 4G. In one embodiment, the sacrificial layer 434 and the remaining portion 438 of the dielectric material 425 have the same etch rate, and a top surface 440 is planar after the removal process. The removal process may be ion milling or RIE.

Figure 4H:
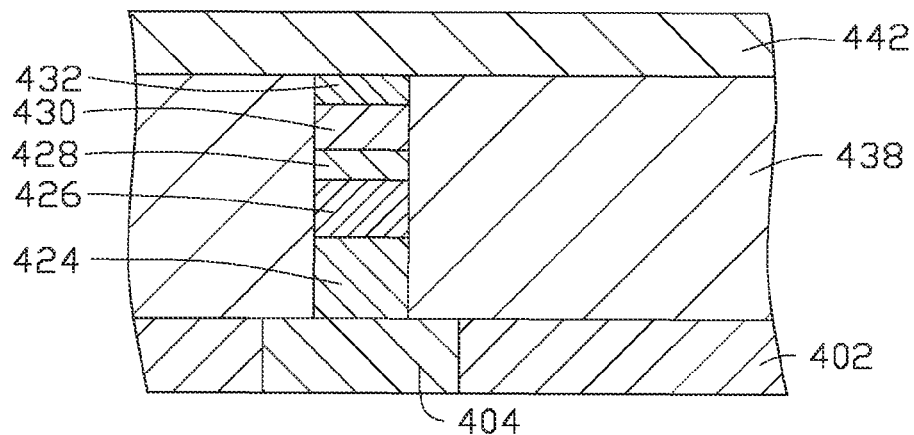
Figure 4I:
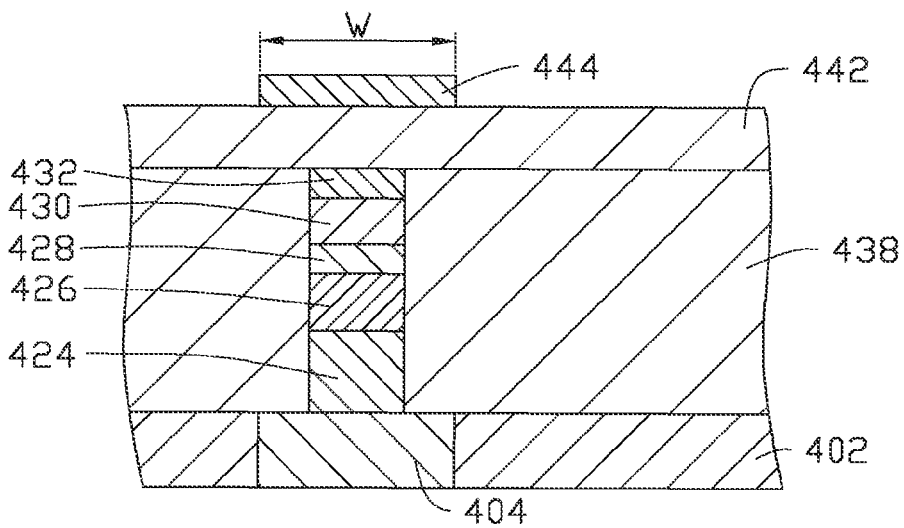
Figure 4J:
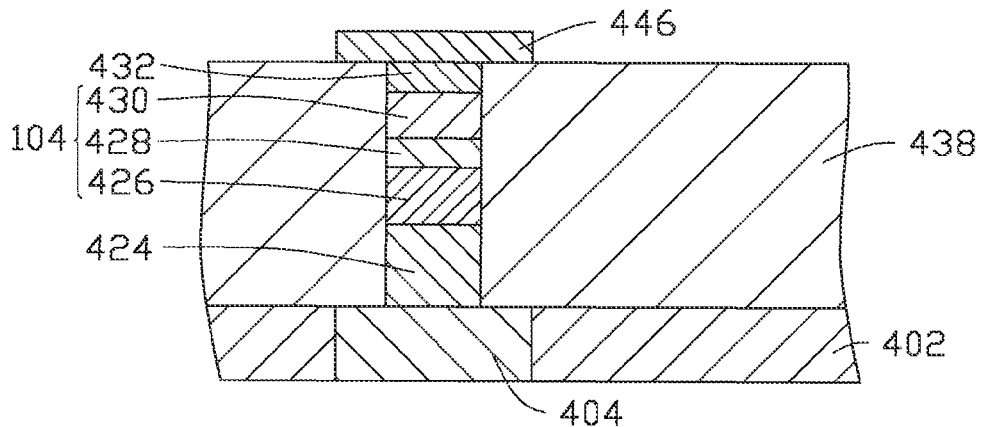

A third SOT layer 442 is formed on the top surface 440, as shown in FIG. 4H. The third SOT layer 442 may be made of the same material as the lead 102. A photoresist 444 may be formed on the third SOT layer 442, as shown in FIG. 4I. The photoresist 444 may be patterned into stripes with a constant width W or to have a plurality of regions with narrower width W and a plurality of regions with wider width $W_1$. The pattern of the photoresist 444 is transferred to the third SOT layer 442 by removing portions of the third SOT layer 442 not covered by the photoresist 444, forming a lead 446, as shown in FIG. 4J. The removal process may be ion milling or RIE. The lead 446 may be the lead 102 having a constant width W as shown in FIG. 1 or may be the lead 102 having a plurality of first portions having the width W and a plurality of second portions having the width $W_1$ as shown in FIG. 2. The reference layer 426, the barrier layer 428, and the free layer 430 may form the memory cell 104.

Figure 5A:
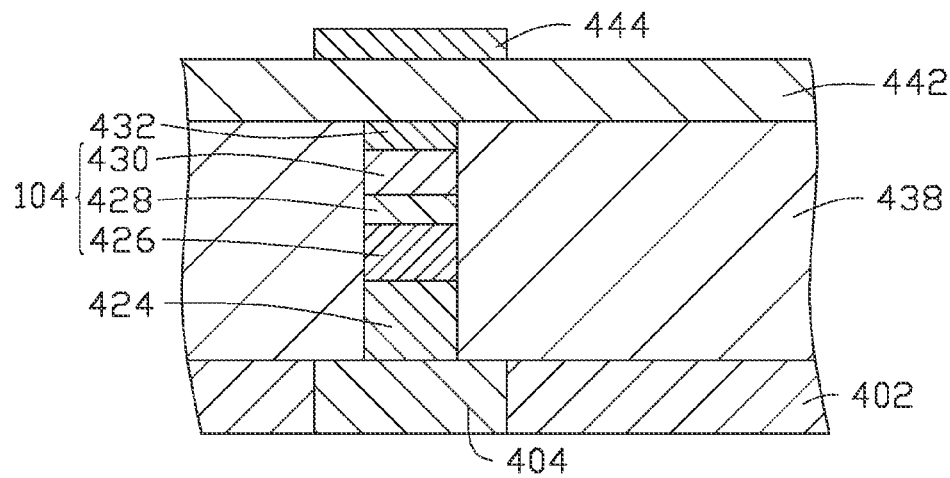
FIGS. 5A-5E schematically illustrate process steps to form the lead and the memory cell according to another embodiment described herein.
Figure 5B:
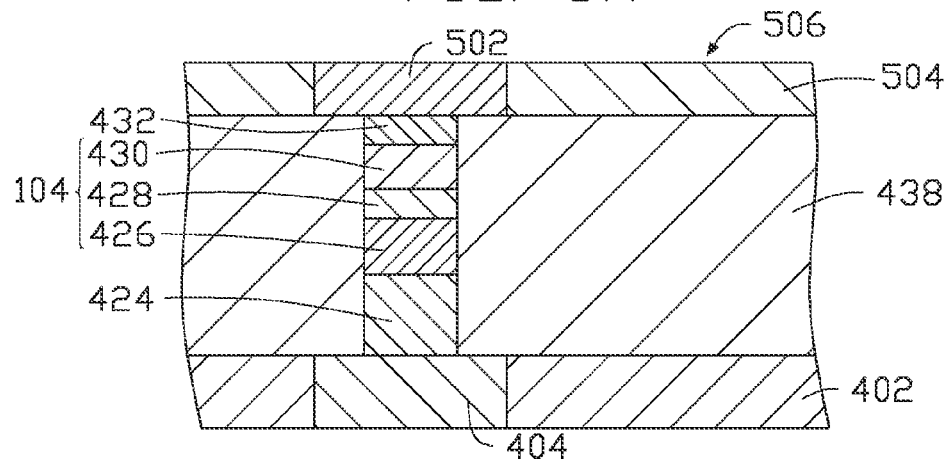
Figure 5C:
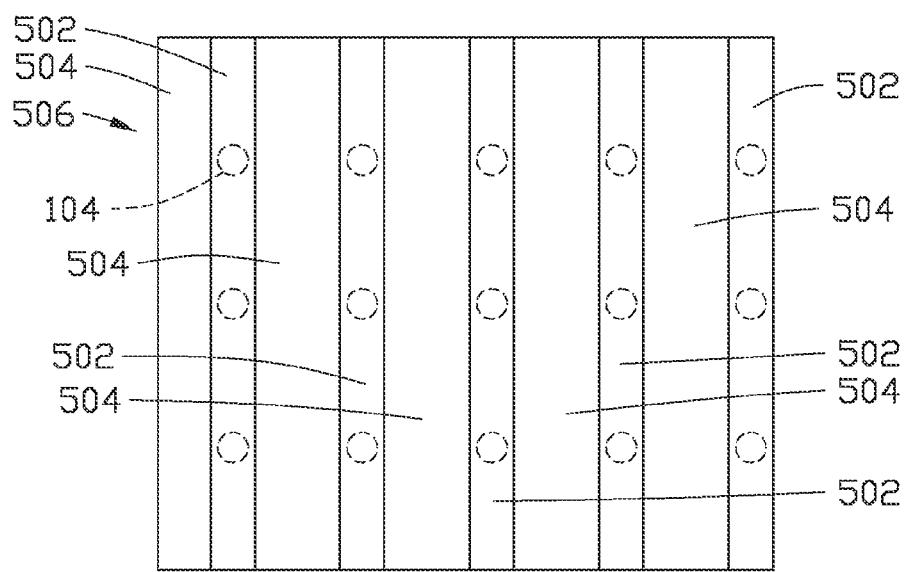

FIGS. 5A-5E schematically illustrate process steps to form the lead 102 and the memory cell 104 according to another embodiment described herein. As shown in FIG. 5A, the starting structure is the same as the structure shown in FIG. 4I, and the memory cell 104 may include the reference layer 426, the barrier layer 428, and the free layer 430. Next, the pattern of the photoresist 444 is transferred to the third SOT layer 442, forming a SOT layer 502, as shown in FIG. 5B. A conductive layer 504 is deposited in regions where the portions of the SOT layer 442 were removed, forming a planar top surface 506 having the SOT layer 502 and conductive layer 504. Alternatively, instead of removing portions of the SOT layer 442 to form the SOT layer 502, portions of the SOT layer 442 not covered by the photoresist 444 are doped with a dopant, such as nitrogen, to decrease electrical resistivity. Thus, the portion of the SOT layer 442 covered by the photoresist 444 is the SOT layer 502, and the doped portion of the SOT layer 442 is the conductive layer 504. Alternatively, instead of doping the portion of the SOT layer 442 not covered by the photoresist 444, a material having lower electrical resistivity is deposited on the portion of the SOT layer 442 not covered by the photoresist 444. The material having lower electrical resistivity may be a conductive metal. Thus, the conductive layer 504 may be a bilayer including a SOT layer and a conductive metal layer. The conductive layer 504 may be made of the same material as the second portion 304 of the lead 102 (FIG. 3). FIG. 5C is a top view of the top surface 506 shown in FIG. 5B. As shown in FIG. 5C, the top surface 506 includes alternating stripes of SOT layer 502 and conductive layer 504. Each stripe of the SOT layer 502 may be over a plurality of memory cells 104, indicated by dotted lines.

Figure 5D:
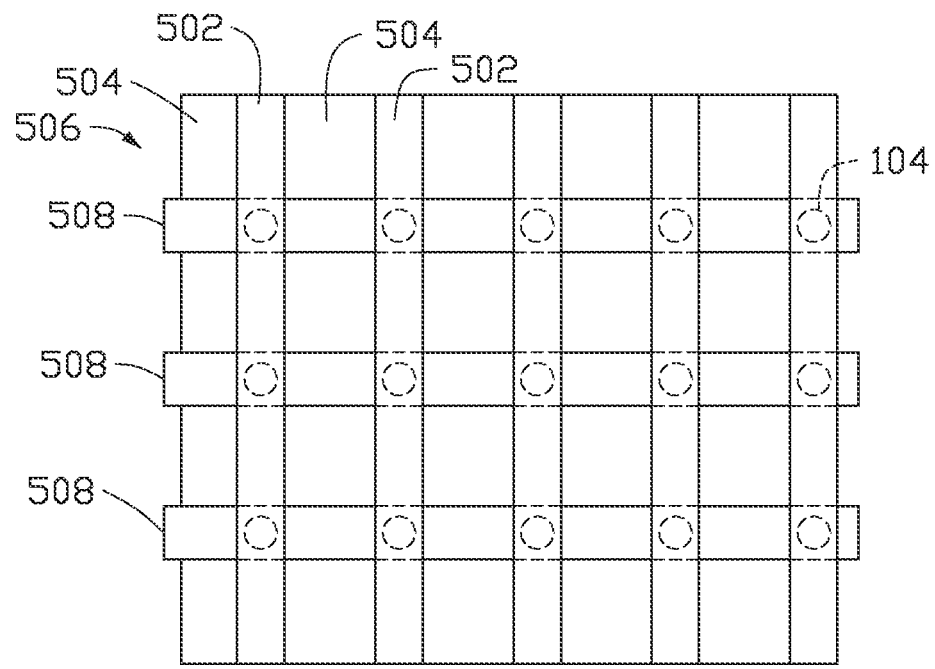
Figure 5E:
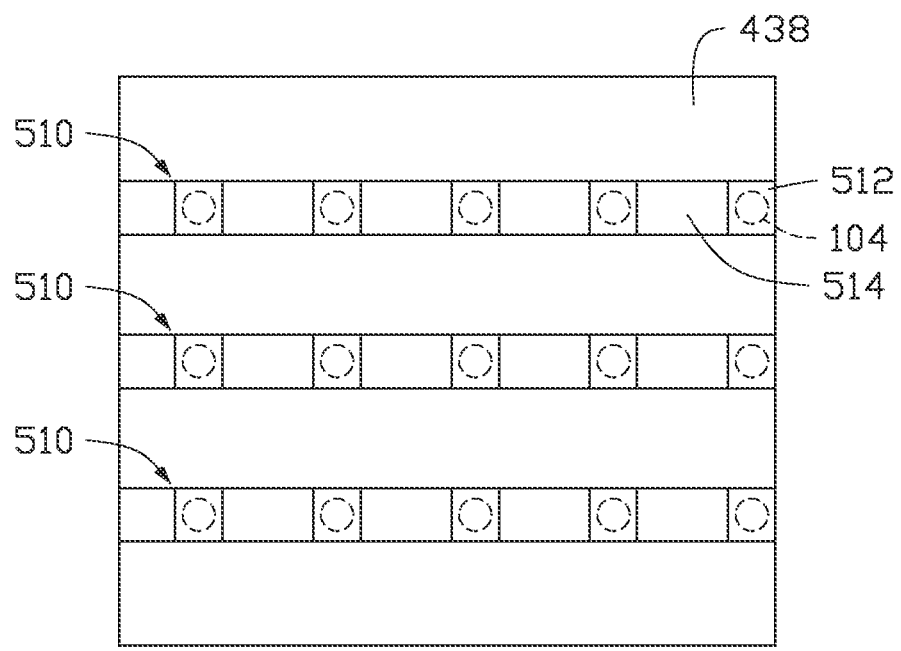

Next, a photoresist may be deposited on the top surface 506 and patterned to form a plurality of photoresist stripes 508, as shown in FIG. 5D. Each photoresist stripe 508 may be aligned with a plurality of memory cells 104 and may be perpendicular to the stripes of the SOT layer 502 and conductive layer 504. Portions of the SOT layer 502 and conductive layer 504 not covered by the photoresist stripes 508 are removed, forming a plurality of leads 510, as shown in FIG. 5E. The photoresist stripes 508 may be removed by a liftoff process. Each lead 510 may include a plurality of first portions 512 and a plurality of second portions 514 distinct from the first portions 512. The first portions 512 may be the remaining portions of the SOT layer 502 and the second portions 514 may be the remaining portions of the conductive layer 504. The lead 510 may be the lead 102, the first portions 512 may be the first portions 302 (FIG. 3), and the second portions 514 may be the second portions 304 (FIG. 3).

Figure 6A:
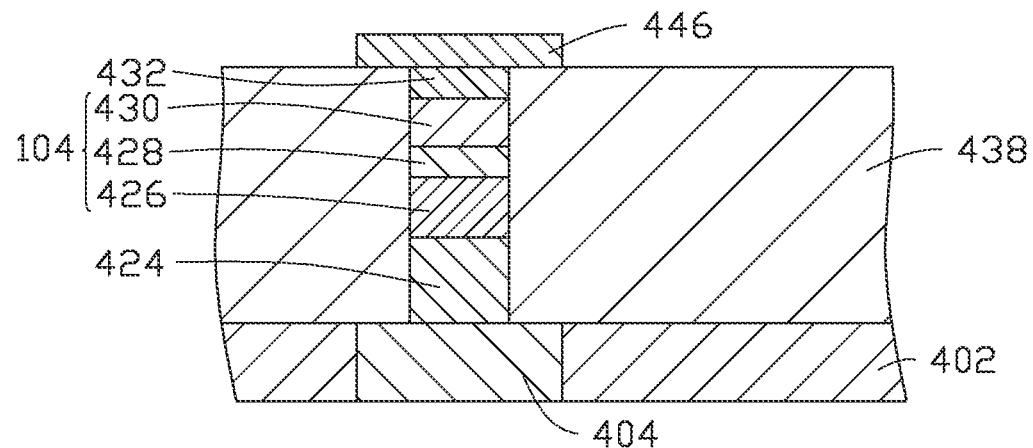
FIGS. 6A-6D schematically illustrate process steps to form the lead and the memory cell according to another embodiment described herein.
Figure 6B:
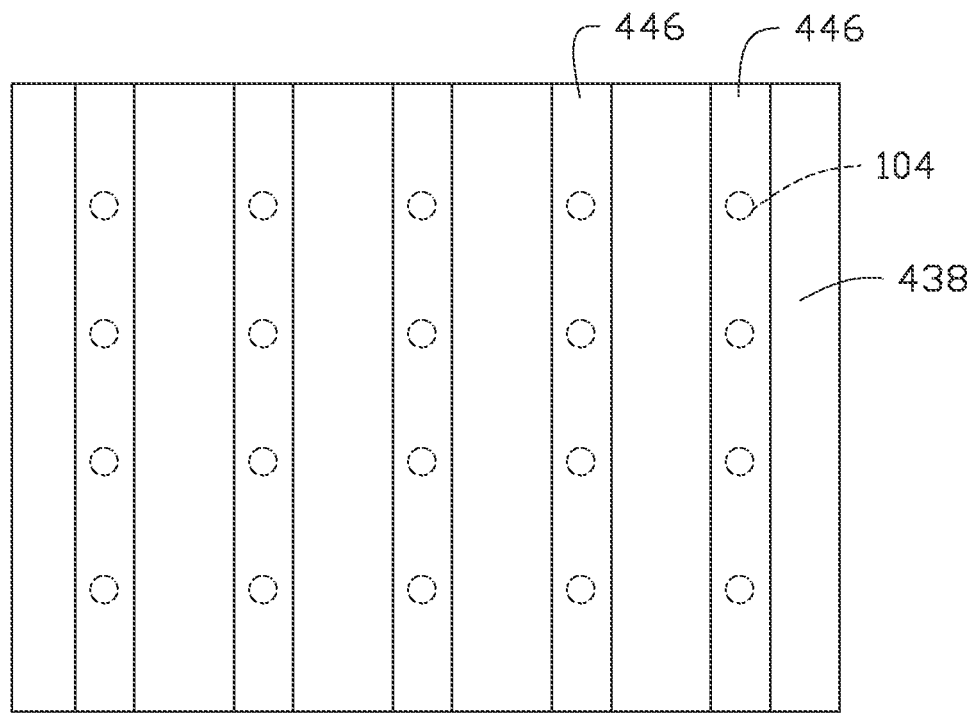
Figure 6C:
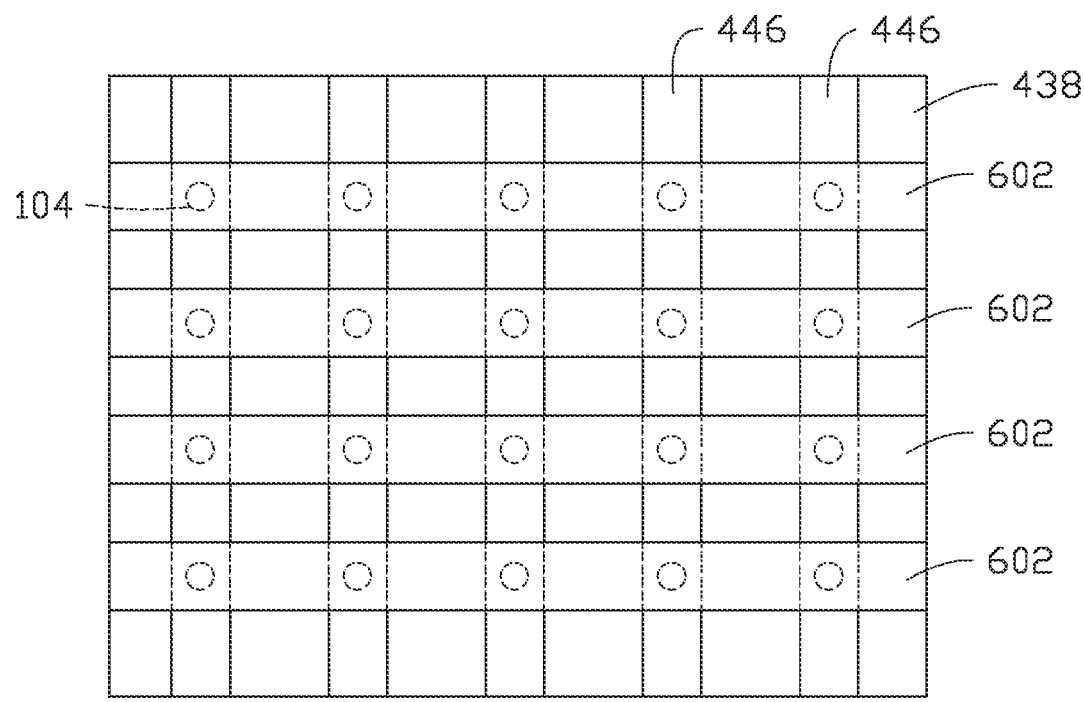
Figure 6D:
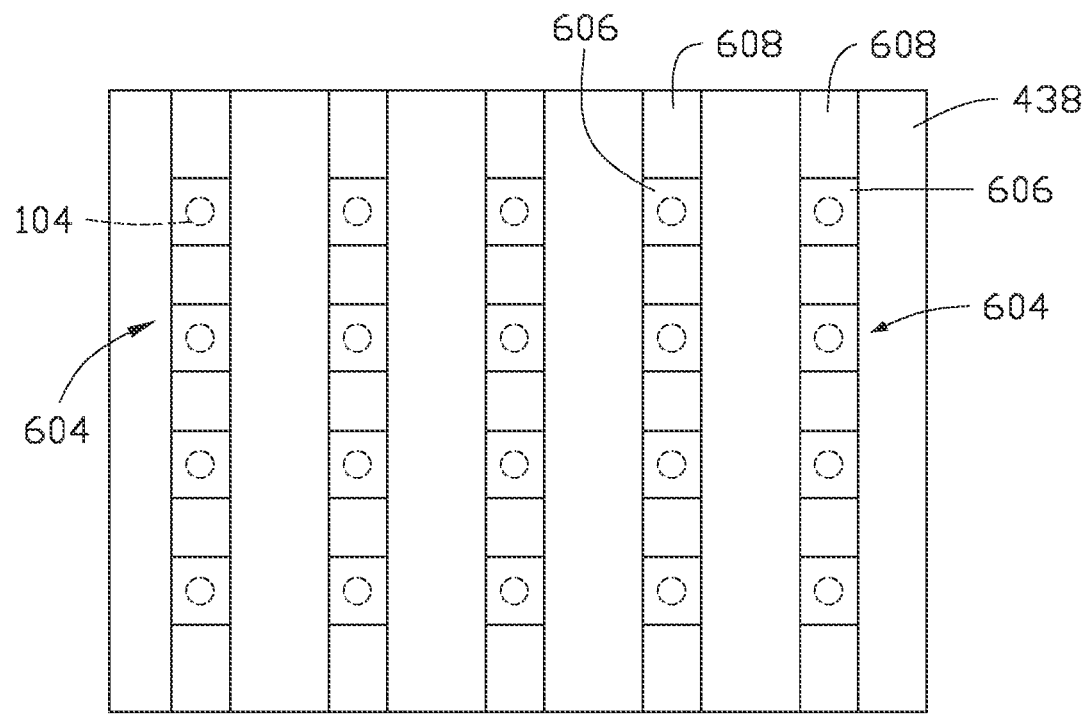

FIGS. 6A-6D schematically illustrate process steps to form the lead 102 and the memory cell 104 according to another embodiment described herein. As shown in FIG. 6A, the starting structure is the same as the structure shown in FIG. 4J, and the memory cell 104 may include the reference layer 426, the barrier layer 428, and the free layer 430. FIG. 6B is a top view of the structure shown in FIG. 6A. As shown in FIG. 6B, a plurality of leads 446 are formed on the remaining portion 438 of the dielectric material 425. Next, a photoresist may be deposited on the plurality of leads 446 and the remaining portion 438 of the dielectric 425. The photoresist may be patterned to form a plurality of photoresist stripes 602, as shown in FIG. 6C. Each photoresist stripe 602 may be aligned with a plurality of memory cells 104 and may be perpendicular to the leads 446. Portions of the lead 446 not covered by the photoresist stripes 602 may be doped with a dopant in order to reduce the electrical resistivity. Next, the photoresist stripes 602 may be removed by a liftoff process, and a plurality of leads 604 are formed on the remaining portion 438 of the dielectric material 425. Each lead 604 may include a plurality of first portions 606 and a plurality of second portions 608 distinct from the first portions 606. The first portions 512 may be the portions of the leads 446 covered by the photoresist stripes 602 and the second portions 514 may be the doped portions of the leads 446. The lead 604 may be the lead 102, the first portions 606 may be the first portions 302 (FIG. 3), and the second portions 608 may be the second portions 304 (FIG. 3).

In summary, a SOT-MRAM chip architecture including a plurality of leads, a plurality of memory cells, and a plurality of transistors is disclosed. The lead may include first portions coupled to the memory cells and second portions not coupled to the memory cells. The first portions are made of SOT material having large spin-orbit coupling strength, and the first portions are relatively thin and narrow. The second portions are wider than the first portions and/or are made of a more electrically conductive material. Having the second portions decreases overall electrical resistivity of the lead, leading to increased power efficiency.

While the foregoing is directed to embodiments of the disclosure, other and further embodiments may be devised without departing from the basic scope thereof, and the scope thereof is determined by the claims that follow.

What is claimed is:

1. A magnetoresistive random access memory (MRAM) device, comprising:
    two or more leads, wherein at least one lead comprises a first portion and a second portion, the first portion having a first width that is different from a second width of the second portion;
    a memory cell coupled to each lead; and
    a transistor coupled to the memory cell.

2. The device of claim 1, wherein the memory cell comprises a reference layer, a barrier layer, and a free layer.

3. The device of claim 2, wherein the free layer is in contact with the lead, and wherein a writing process is performed by a half-select mechanism that includes a combination of flowing a current along a lead of the two or more leads and applying a voltage to the memory cell.

4. The device of claim 2, further comprising a spin-orbit torque layer disposed between the free layer of the memory cell and the lead.

5. A magnetoresistive random access memory ( MRAM) device, comprising:
    a lead comprising a first portion and a second portion distinct from the first portion, wherein the first portion has a first width and the second portion has a second width, and wherein the first width is smaller than the second width;
    a memory cell coupled to the first portion of the lead; and
    a of transistor coupled to the memory cell.

6. The device of claim 5, wherein the memory cell comprises a reference layer, a barrier layer, and a free layer.

7. The device of claim 6, wherein the free layer is in contact with the first portion, and wherein a writing process is performed by a half-select mechanism that includes a combination of flowing a current along the lead and applying a voltage to the memory cell.

8. The device of claim 6, further comprising a spin-orbit torque layer disposed between the free layer of the memory cell and the first portion.

9. The device of claim 5, wherein the lead is made of a material selected from the group consisting of Pt, Ta, W, Hf, Ir, CuBi, CuIr, and AuW.

10. The device of claim 5, wherein the first portion is in contact with the memory cell and the second portion is spaced from the memory cell.

11. The device of claim 5, wherein the first width ranges from about 10 nm to about 500 nm and the second width ranges from about 10 nm to about 500 nm.

12. A magnetoresistive random access memory( MRAM) device, comprising:
    a lead comprising a first portion and a second portion distinct from the first portion, wherein the first portion is made of a first material and the second portion is made of a second material, and wherein the first material is different from the second material;
    a memory cell coupled to the first portion of the lead; and
    a transistor couple to the memory cell.

13. The device of claim 12, wherein the memory cell comprises a reference layer, a barrier layer, and a free layer.

14. The device of claim 13, wherein the first portion is in contact with the free layer of the memory cell and the second portion is spaced from the memory cell, and wherein a writing process is performed by a half-select mechanism that includes a combination of flowing a current along the lead and applying a voltage to the memory cell.

15. The device of claim 13, wherein the memory cell further comprises a spin-orbit torque layer disposed on the free layer, wherein the first portion is in contact with the spin-orbit torque layer of the memory cell and the second portion is spaced from the memory cell.

16. The device of claim 12, wherein the first material is selected from the group consisting of Pt, Ta, W, Hf, Ir, CuBi, CuIr, and AuW.

17. The device of claim 16, wherein the second material comprises one or more of copper, aluminum, and a material selected from the group consisting of Pt, Ta, W, Hf, Ir, CuBi, CuIr, and AuW that is doped with a dopant.

18. The device of claim 16, wherein the second material comprises one or more layers including at least one layer comprising one or more of copper, aluminum, and a material selected from the group consisting of Pt, Ta, W, Hf, Ir, CuBi, CuIr, and AuW that is doped with a dopant.

19. The device of claim 18, wherein the one or more layers include a first layer comprising one or more of copper and aluminum, and a second layer comprising a material selected from the group consisting of Pt, Ta, W, Hf, Ir, CuBi, CuIr, and AuW.

20. The device of claim 12, wherein the first portion has a first width and the second portion has a second width, and wherein the first width is smaller than the second width.

21. The device of claim 12, wherein the second material comprises the first material with a dopant.

22. The device of claim 21, wherein the first material is tantalum and the second material is tantalum doped with nitrogen.

* * * * *